US006898221B2

(12) United States Patent
Berger et al.

(10) Patent No.: US 6,898,221 B2
(45) Date of Patent: May 24, 2005

(54) APPARATUS FOR FREQUENCY TUNING AND LOCKING AND METHOD FOR OPERATING SAME

(75) Inventors: Jill D. Berger, Los Gatos, CA (US); Subrata K. Dutta, San Jose, CA (US); Alan A. Fennema, San Jose, CA (US); Olga A. Gorbounova, Fremont, CA (US); Stephen J. Hrinya, San Jose, CA (US); Fedor A. Ilkov, Sunnyvale, CA (US); David A. King, Menlo Park, CA (US); Heather L. Tavernier, Mountain View, CA (US); Alexander A. Tselikov, Fremont, CA (US)

(73) Assignee: Iolon, Inc., San Jose, CA (US)

( * ) Notice: Subject to any disclaimer, the term of this patent is extended or adjusted under 35 U.S.C. 154(b) by 65 days.

(21) Appl. No.: 10/099,414

(22) Filed: Mar. 15, 2002

(65) Prior Publication Data

US 2002/0164125 A1 Nov. 7, 2002

Related U.S. Application Data

(60) Provisional application No. 60/276,570, filed on Mar. 15, 2001, provisional application No. 60/347,934, filed on Oct. 26, 2001, and provisional application No. 60/355,147, filed on Feb. 8, 2002.

(51) Int. Cl.[7] ............................. H01S 3/13; H01S 3/10
(52) U.S. Cl. ...................... 372/32; 372/20; 372/29.011; 372/38.01
(58) Field of Search ............................. 372/20, 32, 98, 372/29.011, 38.01

(56) References Cited

U.S. PATENT DOCUMENTS

| 3,970,838 | A | | 7/1976 | Goodwin et al. | |
|---|---|---|---|---|---|
| 5,331,651 | A | * | 7/1994 | Becker et al. | ................ 372/20 |
| 5,825,792 | A | * | 10/1998 | Villeneuve et al. | ........... 372/32 |
| 5,970,076 | A | | 10/1999 | Hamada | |
| 6,005,995 | A | | 12/1999 | Chen et al. | |
| 6,043,883 | A | | 3/2000 | Leckel et al. | |
| 6,122,301 | A | | 9/2000 | Tei et al. | |
| 6,134,253 | A | | 10/2000 | Munks et al. | |
| 6,243,403 | B1 | * | 6/2001 | Broutin et al. | ................ 372/20 |
| 6,272,157 | B1 | * | 8/2001 | Broutin et al. | ................ 372/20 |
| 6,366,592 | B1 | * | 4/2002 | Flanders | ...................... 372/18 |
| 6,400,737 | B1 | * | 6/2002 | Broutin et al. | ................ 372/20 |
| 6,529,534 | B1 | * | 3/2003 | Yasuda | ........................ 372/20 |
| 2001/0003482 | A1 | | 6/2001 | Zare et al. | |
| 2002/0088920 | A1 | | 7/2002 | Imajuku et al. | |

FOREIGN PATENT DOCUMENTS

| WO | WO 01/08277 | 2/2001 |
|---|---|---|
| WO | WO 01/11738 | 2/2001 |

OTHER PUBLICATIONS

Yariv, Amnon, "Optical Electronics, Fourth Edition", *Saunder College Publishing*, pp. 112–115.
Frenkel et al., "Angle–Tuned Etalon Filters for Optical Channel Selection In High Density Wavelength Division Multiplexed Systems", *Journal of Lightwave Technology*, vol. 7, No. 4, Apr. 1989, pp. 615–624.

* cited by examiner

*Primary Examiner*—Minsun Oh Harvey
*Assistant Examiner*—James Menefee
(74) *Attorney, Agent, or Firm*—Dorsey & Whitney LLP

(57) ABSTRACT

An apparatus comprising a first reference element having an output power that varies monotonically with input frequency over an operating frequency range and receiving at least a portion of an output beam of light from an optical source. A second reference element having an output power that is frequency dependent receives at least a portion of the output beam of light. A first optical detector measures the power of a first reference beam of light from the first reference element. A second optical detector measures the power of a second reference beam of light from the second reference element. Electronic circuitry is coupled to the first and second optical detectors for receiving first and second reference signals therefrom and producing a coarse error signal for permitting coarse adjustment and a fine error signal for permitting fine adjustment of the frequency of the output beam of light.

44 Claims, 9 Drawing Sheets

APPARATUS FOR FREQUENCY TUNING AND LOCKING AND METHOD FOR OPERATING SAME

CROSS-REFERENCE TO RELATED APPLICATION

The application claims priority to U.S. provisional patent application Ser. No. 60/276,570 filed Mar. 15, 2001, U.S. provisional patent application Ser. No. 60/347,934 filed Oct. 26, 2001 and U.S. provisional patent application Ser. No. 60/355,147 filed Feb. 8, 2002, the entire contents of which are incorporated herein by this reference.

FIELD OF THE INVENTION

The present invention relates generally optical sources and more particularly to apparatus for locking the frequency of a tunable optical source.

BACKGROUND

Tunable optical sources are commonly used for applications in the ultraviolet, visible and infrared regions of the optical spectrum. The output frequency or wavelength of such a source may be tuned in a continuous or stepwise fashion. In one exemplary application, single-frequency, extended cavity semiconductor lasers (ECL's) with a tuning range of approximately 40 nanometers around a center wavelength of 1540 nanometers have been developed for telecommunications applications. In many applications, it is often desirable to lock the output frequency of a tunable optical source to a predetermined frequency. In a telecommunications system, for example, the output wavelength may be locked to a single frequency in a predetermined International Telecommunications Union (ITU) frequency grid.

Frequency or wavelength lockers have heretofore been provided. The use of an etalon in a wavelength locker is described in U.S. Pat. No. 6,005,995 of Chen et al. Properties of Fabry-Perot etalons are discussed in "Angle-tuned etalon filters for optical channel selection in high density wavelength division multiplexed systems," by A. Frenkel and C. Lin, Journal of Lightwave Technology, Vol. 7, pp. 615–624 (1989). See also §4.1 of Optical Electronics, A. Yariv, $4^{th}$ Ed., Saunders College Publishing, Philadelphia, 1991.

Unfortunately, etalons and other reference elements with multipeaked transmission spectra used in frequency or wavelength lockers typically require an additional measurement system to distinguish between transmission peaks. Systems that provide this additional measurement functionality have been provided. See, for example, International Publication Number WO 01/08277 assigned to New Focus, Inc. which discloses a channel selector and an etalon. An alternative approach is disclosed in International Publication Number WO 01/11738 assigned to Coretek, Inc. wherein a first etalon is used as a wavelength locker and a filter and second etalon are used to determine a single known wavelength that can be used to calibrate the transmission profile of the first etalon. A disadvantage of this approach is that the system must tune back to the single reference wavelength in order to recalibrate if a particular instability in the source causes discontinuities in the source wavelength control. U.S. Pat. No. 5,970,076 of Hamada discloses identifying peaks in an etalon transmission using the combination of a fiber grating, optical coupler and an etalon with a large free spectral range. Disadvantages of this approach include a comparatively limited range of operating frequencies and a large degree of optomechanical complexity.

Frequency or wavelength lockers using reference elements with monotonic transmission functions have been disclosed. See, for example, U.S. Pat. No. 6,043,883 of Leckel et al., which discloses a wavemeter device that uses the dispersive phase retardation of a polarized input beam to generate a monotonic transmission function. A limitation of this device is that the derived error signal has a shallow slope that is not optimal for frequency locking to a grid of narrowly spaced frequencies because environmental and electronic noise act to limit the ability to distinguish between and lock to individual grid frequencies.

U.S. Pat. No. 6,134,253 of Munks et al. discloses an apparatus wherein the input beam from the device to be frequency or wavelength locked is split into two secondary beams that each incident on a filter. The apparatus disadvantageously relies on actively tuning one or both of the filters. A wavelength locker is disclosed in U.S. Pat. No. 6,122,301 of Tei et al. that relies on the measurement of the light power reflected and transmitted by a dielectric reflector with a transmission function that varies monotonically with wavelength. Unfortunately, the error signal that can be derived from this optical apparatus has a shallow slope that is not optimal for wavelength locking.

In general, it is an object of the present invention to provide an apparatus for frequency tuning and locking for use with an optical tunable source.

Another object of the invention is to provide an apparatus for frequency tuning and locking that separately optimizes the locking and tuning signals.

Another object of the invention is to provide an apparatus for frequency tuning and locking of the above character which has a relatively high immunity to external environmental forces such as mechanical shock and vibration.

Another object of the invention is to provide an apparatus for frequency tuning and locking of the above character which is suitable for use in an optical telecommunications system.

Another object of the invention is to provide an apparatus for frequency tuning and locking of the above character that is of minimal size.

Another object of the invention is to provide an apparatus for frequency tuning and locking of the above character that has a minimal component count.

Another object of the invention is to provide an apparatus for frequency tuning and locking of the above character that may be manufactured at a reduced cost.

SUMMARY OF THE INVENTION

An apparatus for frequency tuning and locking for use with an optical source tunable over an optical frequency range and producing an output beam of light having a frequency is provided. The apparatus comprises a first reference element having an output power that varies monotonically with input frequency over the operating frequency range and is adapted to receive at least a portion of the output beam of light. The first reference element produces a first reference beam of light. A second reference element having an output power that is frequency dependent is adapted to receive at least a portion of the output beam of light and produce a second reference beam of light is provided. A first optical detector measures the power of the first reference beam of light and produces a first reference signal. A second optical detector measures the power of the second reference beam of light and produces a second reference signal. Electronic circuitry is coupled to the first and second optical detectors for receiving the first and second reference signals and producing a coarse error signal for permitting coarse adjustment of the frequency of the output beam of light and a fine error signal for permitting fine adjustment of the frequency of the output beam of light.

BRIEF DESCRIPTION OF THE DRAWINGS

The accompanying drawings, which are somewhat schematic and are incorporated in and form a part of this specification, illustrate several embodiments of the invention and, together with the description, serve to explain the principles of the invention.

DESCRIPTION OF THE INVENTION

Figure 1:
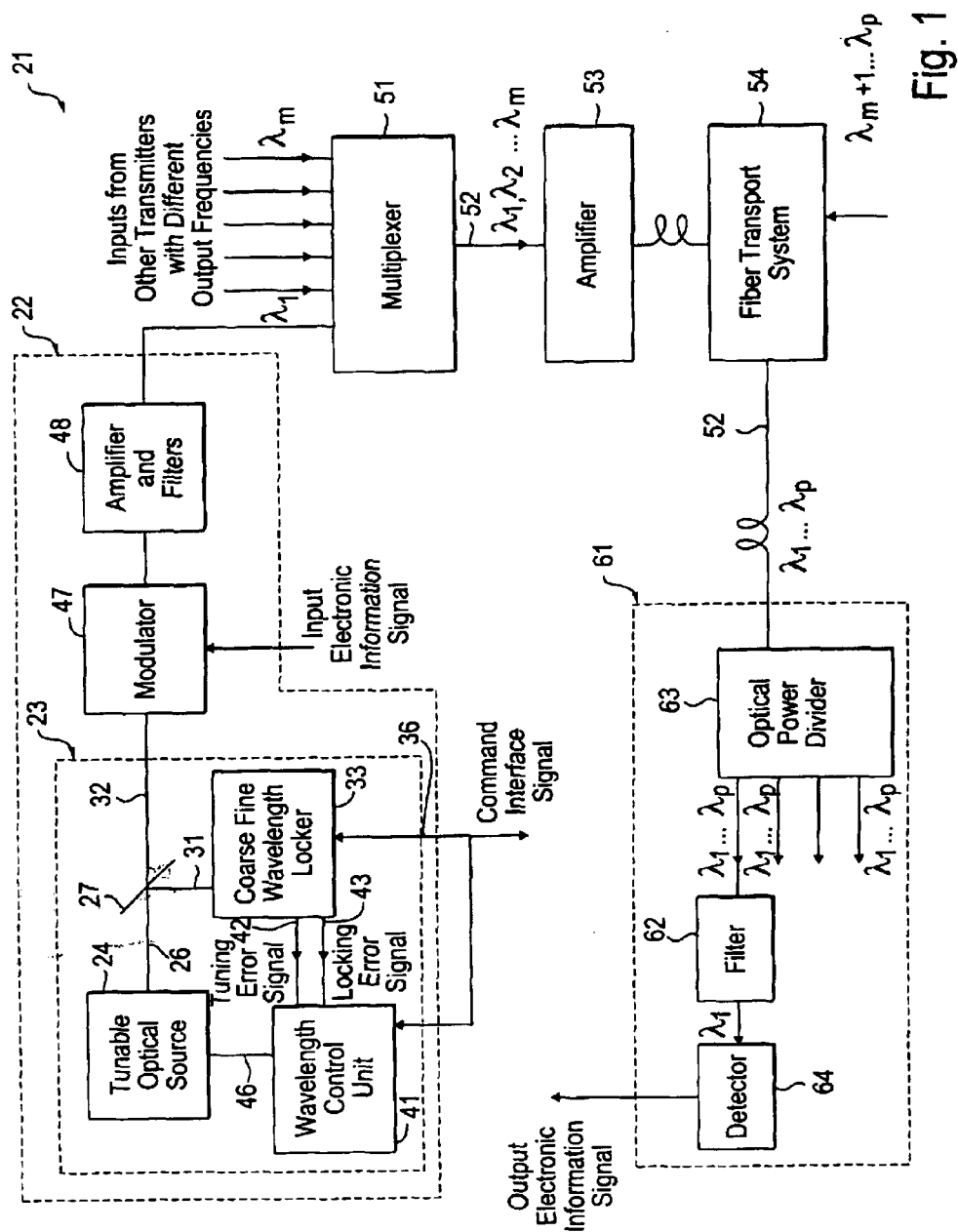
FIG. 1 is a block diagram of a lightwave communications system incorporating a stabilized laser having the apparatus for frequency tuning and locking of the present invention.

Locked or stabilized lasers can be used in a variety of applications where it is desirable to tune to a plurality of selected frequencies. One preferred application is a light wave communications or telecommunications system of the type shown in FIG. 1. One or more optical transmitters 22 for inputting respective modulated optical signals into the system are provided in the system. For simplicity, only one of such optical transmitters 22 is shown in FIG. 1 and includes a locked or stabilized laser 23. Any suitable tunable optical source 24 is included within stabilized laser 23 for producing an output beam of light of a selected frequency and wavelength. Optical source 24 has at least one output beam of light, such as beam 26 in FIG. 1 and, in this regard, can have multiple output beams with identical spectral features. Where multiple beams are provided, the majority of the output power is carried by the primary output beam, such as beam 26, and significantly less power by the other secondary beams. In one preferred embodiment, the optical source 24 is an extended cavity semiconductor laser of the type disclosed in U.S. patent application Ser. No. 09/728,212 filed Nov. 29, 2000, the entire content of which is incorporated herein by this reference. Optical source 24 may be tunable across a band of wavelengths within the erbium fiber gain bandwidth, for example, the Conventional or C-band covering a range of approximately 35 nanometers from 1530 nanometers to 1565 nanometers. The corresponding frequency span is approximately 4.4 THz with a lower frequency bound of approximately 191 THz. The source 24 may, for example, be locked to one of a grid of frequencies with a fixed separation of 50 GHz and a reference frequency of 193.1 THz, commonly referred to as a 50 GHz ITU grid.

Input beam 26 is incident on a optical power divider 27 of any suitable type so as to be split into a reference beam 31 and an output beam 32. In one embodiment, power divider 27 is a dielectric or polarization beam splitter having a reflectivity ranging from approximately 1% to 20% and preferably approximately 5%. Reference beam 31 is directed into a suitable wavelength locker such as the apparatus for frequency tuning and locking 33 of the present invention. A command interface signal 36 is supplied to apparatus or wavelength locker 33 for selecting the frequency of input beam 26 produced by tunable optical source 24. Wavelength or frequency locker 33 is electrically coupled to a wavelength control unit 41 and, as more filly described below, provides a coarse or tuning error signal 42 and a fine or locking error signal 43 to control unit 41. Command interface signal 36 is additionally supplied to wavelength control unit 41, which is electrically coupled to optical source 24 so as to provide a wavelength control signal 46 to the optical source.

Optical transmitter 22 further includes an optical modulator 47 of any suitable type which receives output beam 32 of stabilized laser 23. An input electronic information signal is provided to modulator 47 for permitting output beam 32 to be encoded in a conventional manner. Optical transmitter 22 can optionally further include a tunable or other optical filter for shaping the encoded beam received from modulator 47 and an amplifier for amplifying such beam. Such optional filter and amplifier are shown together for simplicity in FIG. 1 and identified by reference number 48.

The output beam from single-frequency optical transmitter 22, identified as $\lambda_1$ in FIG. 1, is thereafter combined with one or more additional modulated beams, each of which is tuned to a different operating frequency and wavelength. Such additional modulated beams are identified as $\lambda_2$ through $\lambda_m$ in FIG. 1 and form a single transmitting station. A conventional multiplexer 51 is provided for combining such modulated beams into a single multiplexed beam 52. An optional amplifier 53, such as an erbium fiber or Raman amplifier, can be provided for amplifying multiplexed beam 52 before such beam is coupled into a fiber optic transport system 54. The transport system may include other optical amplifiers, tunable filters, optical switches, add/drop multiplexers, power equalizers and other system components for amplifying, routing and shaping the spectrum of the multiplexed light wave signal. Other transmitting stations can input one or more modulated optical beams into fiber optic transport system 54. Exemplary modulated beams $\lambda_{m+1}$ through $\lambda_p$ from another transmitting station are shown as being inputted into the system 54 in FIG. 1.

Multiplexed beam 52 is delivered by transport system 54 to an optical receiver 61 which includes any suitable frequency selector such as an optical filter that may be tunable or a demultiplexer. Receiver 61 shown in FIG. 1 has a tunable optical filter 62 for each of the modulated $\lambda_1$ through $\lambda_p$ beams. An optical power divider 63 separates the multiplexed beam into p beams and directs each such beam to a respective optical filter 62, only one of which is shown in FIG. 1. The passband of each tunable optical filter 62 serves to select the frequency signal generated by the optical transmitter 22 corresponding to such frequency. Each resulting modulated beams is then directed to a suitable combination of components to extract the electronic signal therefrom. For example, the output beam for filter 62 is directed to a detector 64 which measures the power of the beam and converts the information carried thereby into an output electronic information signal. If a demultiplexer (not shown) is used for separating the signals from multiplexed beam 52, the several channels produced thereby are similarly directed to different detectors that convert the optical information signals to respective electronic output signals.

Figure 2:
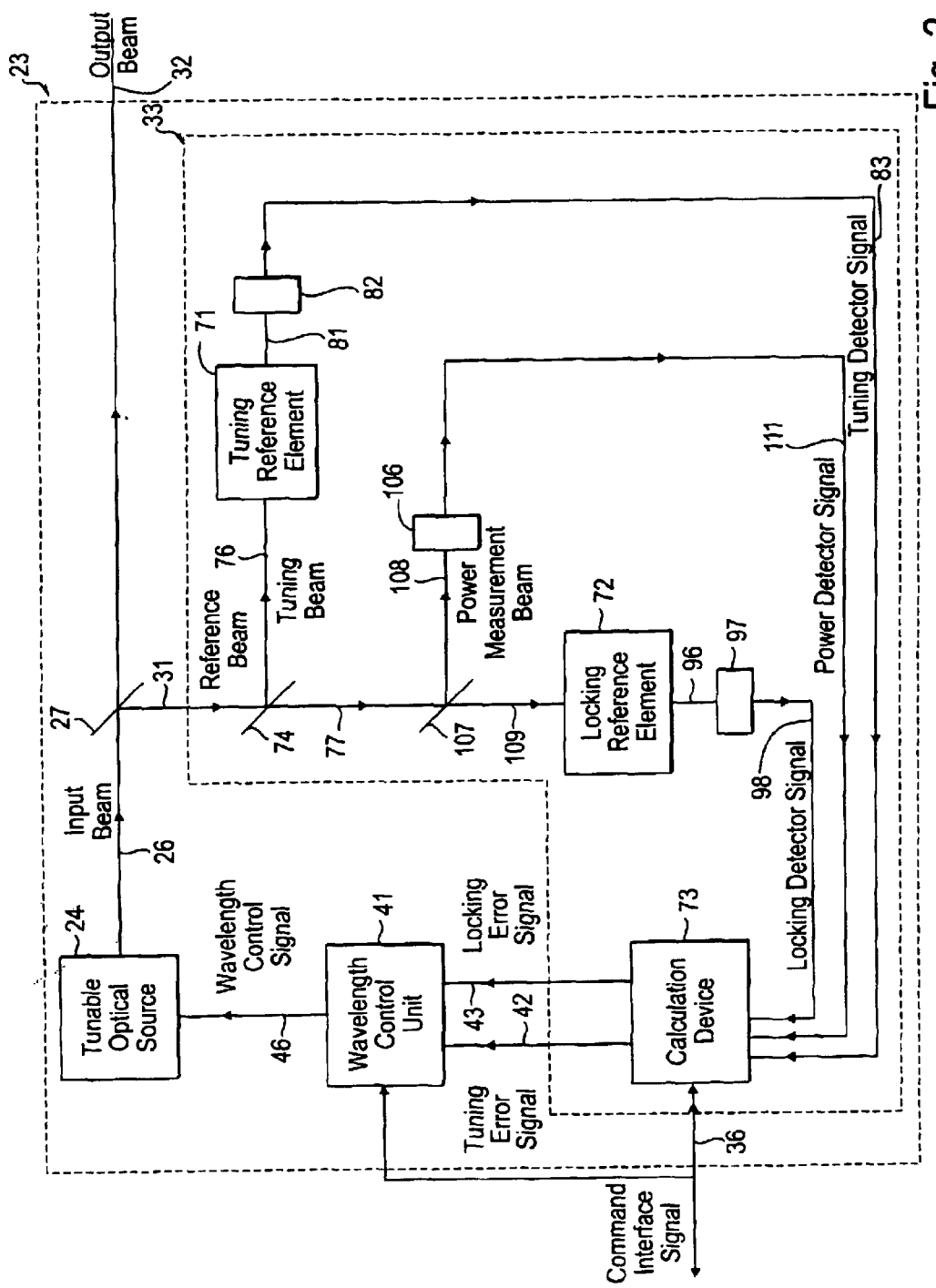
FIG. 2 is a block diagram of the apparatus for frequency tuning and locking of the present invention utilized in the stabilized laser of the lightwave communications system of FIG. 1.

Stabilized laser 23 and particularly wavelength locker 33 are shown in greater detail in FIG. 2. As described therein, the wavelength locker 33 includes a first or tuning reference element 71, second or locking reference element 72 and electronic circuitry which includes calculator or calculation device 73. At least a portion of input beam 26 from optical source 24 is received by or impinges upon tuning reference element or tuning element 71 and at least a portion of such light beam is received by or impinges upon locking reference element or locking element 72. More specifically, a first portion of reference beam 31 is directed to the tuning reference element by means of an optical power divider of any suitable type such as described above with respect to beam splitter 27. Such optical power divider is preferably a second beam splitter 74 which splits the reference beam 31 into a tuning beam 76 directed towards tuning reference element 71 and a locking beam 77 directed towards locking reference element 72.

Figure 3:
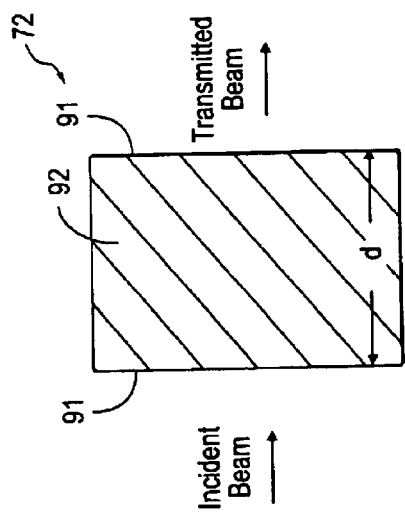
FIG. 3 is a graph showing the ratio of the intensity of the transmitted beam over the intensity of the incident beam as a function of frequency for the tuning reference element in the apparatus for frequency tuning and locking of FIG. 2.

Tuning or coarse reference element 71 has an output power that varies monotonically with input frequency over the operating frequency range of the wavelength locker 33. A suitable transmission curve for tuning reference element 71 is shown in FIG. 3. As illustrated therein, the output transmission of the tuning reference element has a unique power for each input frequency of tuning beam 76. Over the frequencies of interest, the transmission variation is preferably large and may range from 20% to 95% and preferably approximately 75%. The first derivative of the transmission function over the frequencies of interest is preferably substantially constant. More specifically, the route mean squared (RMS) or R-squared value of the transmission of the element 71, that is the measure of the linearity of the such transmission function, is preferentially greater than 0.998 across the operating frequency range of wavelength locker 33.

Representative monotonic elements suitable for use as a tuning reference element 71 include a multi-layer dielectric thin film filter or reflector, a dispersive phase retarder plus at least one polarizer, a slowly varying light absorbing material such as germanium over the range of 1.7 microns to 1.95 microns and a combination of a dispersive Faraday retarder plus at least one polarizer. In one preferred embodiment, tuning element 71 is a dielectric reflector.

Tuning reference element 71 produces a first reference beam of light in the form of filtered tuning beam 81 which is received by a first optical detector 82 electrically coupled to calculation device 73. The first optical detector 82 measures the power of filtered tuning beam 81 and produces a first reference signal or tuning detector signal 83 which is processed by calculation device 73 in the manner set forth below to provide a coarse error signal in the form of tuning error signal 42 for coarse adjustment of the frequency of input beam 26.

Figure 4:
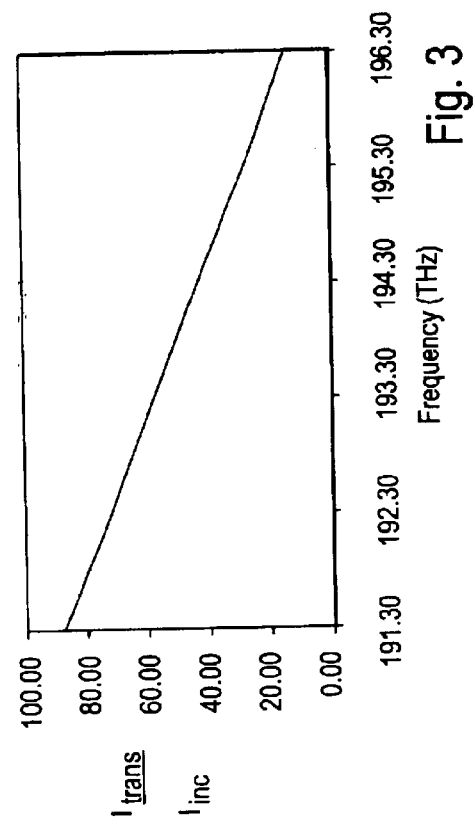
FIG. 4 is a graph showing the ratio of the intensity of the transmitted beam over the intensity of the incident beam as a function of frequency for the locking reference element in the apparatus for frequency tuning and locking of FIG. 2.
Figure 5:
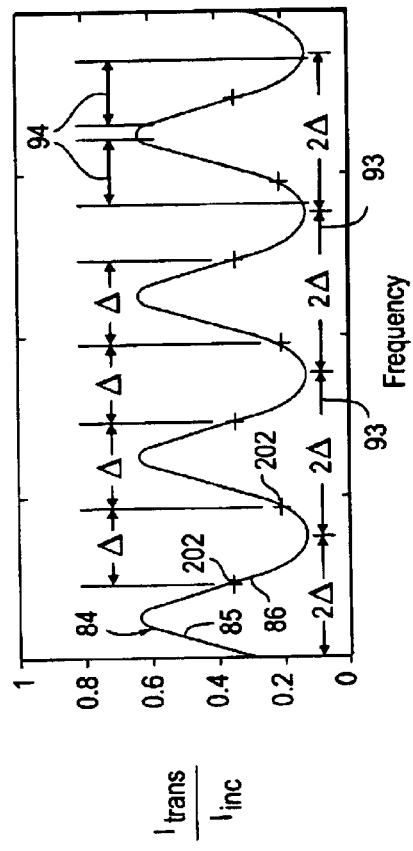
FIG. 5 is one embodiment of the locking reference element utilized in the apparatus for frequency tuning and locking of FIG. 2.

A second portion of reference beam 31 in the form of at least a portion of locking beam 77 is received by locking or fine reference element 72. Locking element 72 has an output power that is frequency dependent and preferably has a multi-peaked transmission spectrum that can be periodic or nonperiodic. The locking element more preferably has a periodically-varying transmission spectrum provided with a plurality of transmission maxima in form of peaks 84 as shown in FIG. 4. Each of such peaks 84 has an increasing portion 85 and a decreasing portion 86. Locking element 72 can be of any suitable type. Elements 72 which may have nonperiodic spectra include liquid and gas absorption cells, resonant absorption cells and solid absorbing or reference materials. Elements 72 with periodic spectra include interferometers and metal film dielectric filters or reflectors. Suitable interferometers include Mach Zender interferometers in bulk optic and guided wave form, fiber Bragg interferometers, air-gapped etalons and Fabry-Perot etalons as shown in FIG. 5. The locking element 72 is preferably an etalon that is formed by first and second spaced-apart reflectors 91 and a medium 92 disposed between the reflectors. Medium 92 is formed from any suitable material such as fused silica, for a solid etalon, or air, for a air-gapped etalon. Locking element or etalon 72 preferably has a finesse ranging from two to four and preferably approximately two.

The etalon 72 has a capture range 93, shown as 2Δ in FIG. 4, preferably approximating the free spectral range of the etalon and a locking range 94 which may be approximately equal to approximating one half the capture range 93. Such capture range is the frequency span over which the control system of laser 23 can uniquely identify the target frequency.

Locking element 72 produces a second reference beam of light in the form of filtered locking beam 96 which is received by a second optical detector 97 electrically coupled to calculation device 73. Second optical detector 97 measures the power of filtered locking beam 96 and produces a second reference signal in the form of locking detector signal 98 which is processed by the calculation device 73 in the manner described below. The portion of locking beam 77 incident on tuning element 72 is the incident beam in FIG. 5 and the filtered locking beam 96 is the transmitted beam in FIG. 5.

Wavelength locker 33 further includes an additional optical detector 106 for measuring the power of input beam 26 (see FIG. 2). In one embodiment, the additional or third optical detector 106 receives a portion of locking beam 77 by means of an optical power divider of any suitable type such as described above. Such optical power divider is preferably a beam splitter 107 which splits the locking beam 77 into a power measurement beam 108 which impinges upon third optical detector 106 and a modified locking beam 109 which impinges on locking element 72. A third optical detector 106 measures the power of measurement beam 108 and produces a power reference signal or power detector signal 111. The third optical detector 106 is electrically coupled to calculation device 73 and the power detector signal 111 is processed by calculation device 73 in the manner described below.

Figure 6:
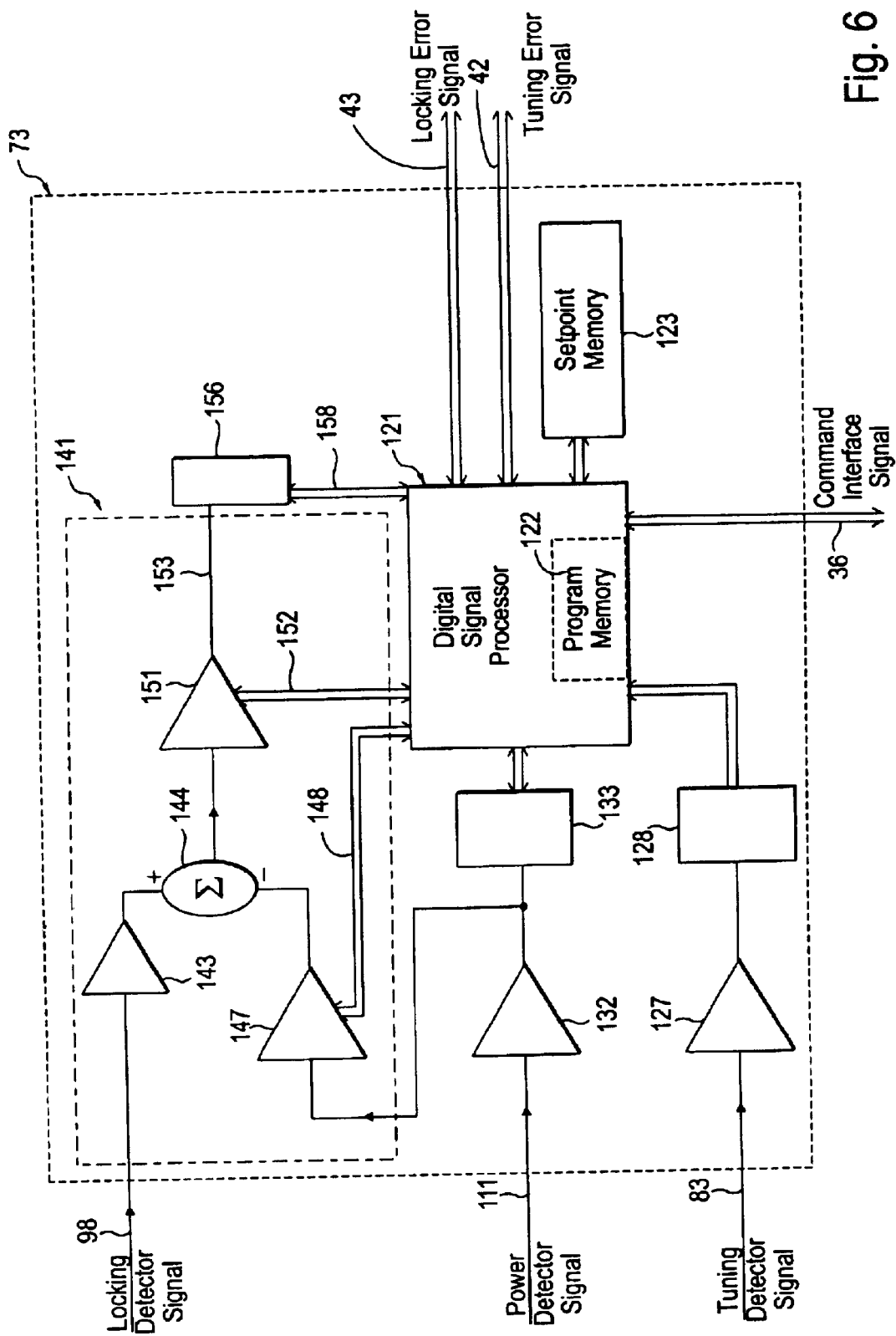
FIG. 6 is a block diagram of the calculation device of the apparatus for frequency tuning and locking of FIG. 2.

One preferred embodiment of calculation device 73 includes a suitable processor such as digital signal processor 121 having internal program memory 122 (see FIG. 6).

External memory such as non-volatile setpoint memory 123 is included in calculation device 73 and coupled to processor 121 by any suitable means such as a bus. A command interface input or signal 36 corresponding to a selected frequency and wavelength of stabilized later 23 is inputted into processor 121 by any suitable means such as a bus. Analog tuning detector signal 83 is amplified by an amplifier 127 and then converted to a digital signal by any suitable analog to digital converter 128. The A/D converter 128 is coupled to processor 121 by any suitable means such as a bus for delivering such digital signal to the processor. Tuning error signal 42 is generated by processor 121 in the manner describe below and outputted by the processor by any suitable means such as a bus. Analog power detector signal 111 is similarly modified for delivery to digital signal processor 121. Specifically, such signal 111 is passed through an amplifier 132 and then converted to a digital signal by analog to digital convertor 133 coupled to processor 121 by any suitable means such as a bus. Amplifiers 127 and 132 change the current modulated signals 83 and 111 produced respectively by optical detectors 82 and 106 to voltage modulated signals which are more suitable for processing in digital signal processor 121.

Calculation device 73 further includes a locking error generator 141 which receives and processes power detector signal 111 and locking detector signal 98 to generate a signal for delivery to processor 121. Analog locking error generator 141 includes an amplifier 143 for changing the current modulated locking detector signal 98 to a voltage modulated signal before delivery of such signal to one input of summation circuitry in the form of summer 144. A programmable gain amplifier such as locking frequency adjust amplifier 147 is coupled to the other input of summer 144. The input of amplifier 147 is coupled to the output of power detector amplifier 132 for receiving power detector signal 111. Adjust amplifier 147 is electrically coupled to digital signal processor 121 by any suitable means such as a bus so that the gain of frequency adjust amplifier 147 can be controlled by a gain signal 148 produced by processor 121. The amplifier 147 has a negative gain so as to additionally serve as a sign-changing element. The output of locking frequency adjust amplifier 147 is a negative number which is added to the amplified value of locking detector signal 98 outputted from amplifier 143 by summer 144 and delivered to a second programmable gain amplifier in the form of error magnitude adjust amplifier 151. Digital signal processor 121 is electrically coupled to error magnitude adjust amplifier 151 by any suitable means such as a bus so that the programmable gain of the error magnitude adjust amplifier can be controlled by a second gain signal 152 produced by processor 121.

The output of locking error magnitude adjust amplifier 151 is coupled to digital signal processor 121 which outputs an analog locking error signal 153. A suitable converter such as analog to digital converter 156 receives locking error signal 153 and converts it to a digitized locking error signal 158 for processing by processor 121. A/D converter 156 is electrically coupled to the digital signal processor 121 by any suitable means such as a bus for delivering signal 158 to the processor. Locking error signal 43 is outputted from processor 121 for permitting fine adjustment of the frequency of input beam 26.

Figure 7:
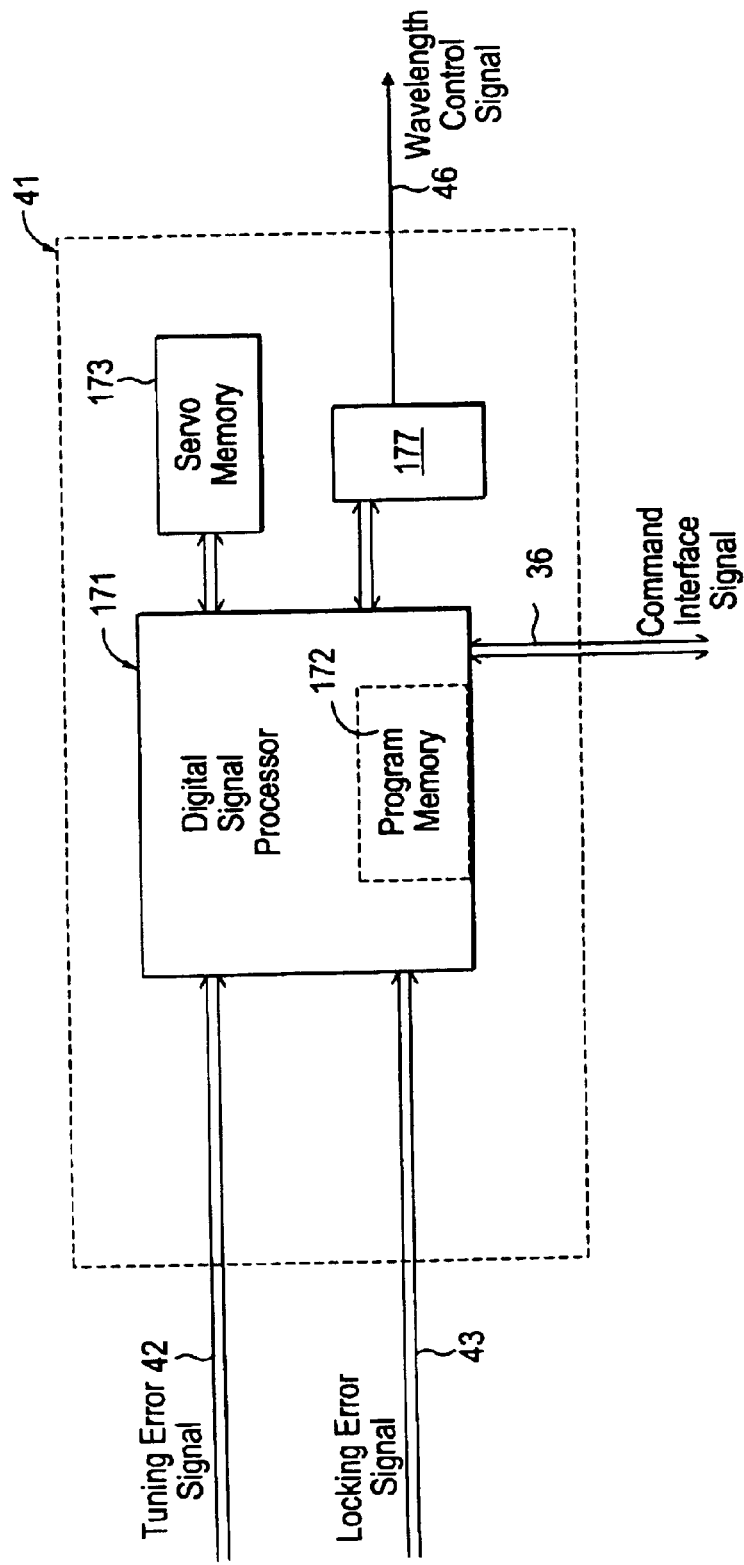
FIG. 7 is a block diagram of the wavelength control unit of the lightwave communications system of FIG. 1 incorporating the frequency tuning and locking device of the present invention.

Tuning error signal 42 and locking error signal 43 generated by wavelength locker 33 and the command interface signal 36 are received by wavelength control unit 41 and processed therein to produce wavelength control signal 46 (see FIGS. 1 and 7). Wavelength control unit 41 includes a suitable processor such as digital signal processor 171 having internal memory such as program memory 172. External memory is coupled to processor 171 and, as shown in FIG. 7, includes non-volatile servo memory 173 coupled to the processor 171 by any suitable means such as a bus. Wavelength control unit 41, and specifically digital signal processor 171 thereof, is electrically coupled to wavelength locker 33 by any suitable means such as a first bus for receiving the digital tuning error signal 42 and a second bus for receiving the digital locking error signal 43. Tuning error signal 42 and locking error signal 43 are processed by digital signal processor 171 in the manner described below and outputted to a suitable digital to analog converter 177 coupled to processor 171 by any suitable means such as a bus. Wavelength control signal 46 is outputted by converter 177 to optical source 24.

It should be appreciated that wavelength control unit 41 and calculation device 73 can have a variety of configurations and be within the scope of the present invention. For example, digital signal processor 121 of calculation device 73 can be combined with digital signal processor 171 of wavelength control unit 41 into a signal processor. In addition, wavelength control unit 41 and calculation device 73 can be combined in a single controller for inclusion inside wavelength locker 33 or outside the locker but within stabilized laser 23.

Figure 8:
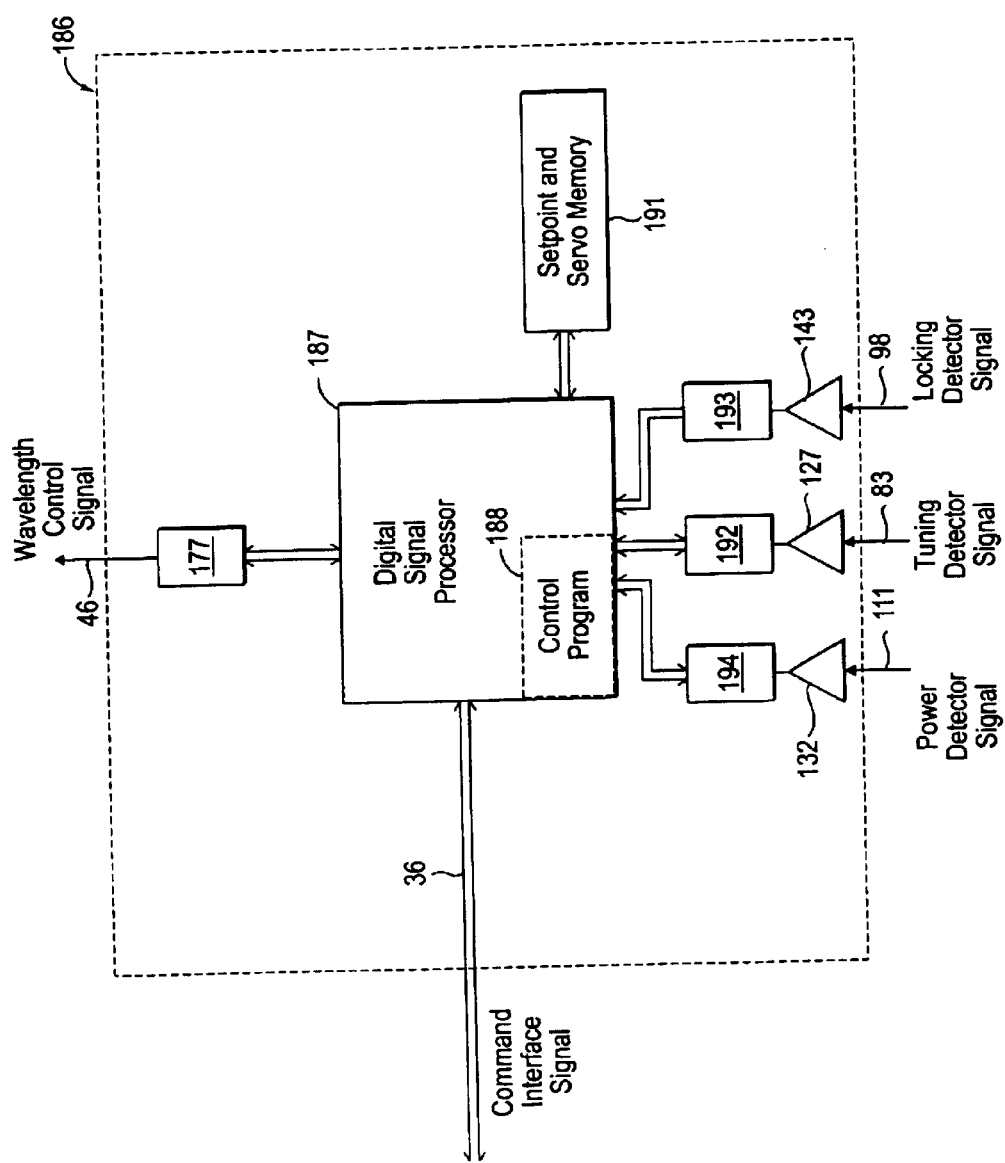
FIG. 8 is a block diagram of an embodiment of a combined calculation device and wavelength control unit for use in the lightwave communications system of FIG. 1.

In one alternative embodiment of the present invention, wavelength control unit 41 and calculation device 73 are combined into a signal digital wavelength controller 186 for inclusion in stabilized laser 23 (see FIG. 8). Controller 186 includes a signal processor of any suitable type and preferably a digital signal processor 187 having an internal control program 188 and memory (not shown). External non-volatile memory is included in controller 186 in the form of setpoint and servo memory 191 coupled to processor 187 by any suitable means such as a bus. Command interface signal 36 is inputted into digital signal processor 187 by any suitable means such as a bus. Tuning detector signal 83, locking detector signal 98 and power detector signal 111, each in an analog form, are amplified by respective amplifiers 127, 143 and 132 and then inputted into respective analog to digital converters 192, 193 and 194, each of which is electrically coupled to processor 187 by a respective bus for delivering the digitized detector signals to the processor 187. Controller 186 includes digital to analog converter 177 for converting the output digital signal of processor 187 into the analog wavelength control signal 46.

The operation and use of optical transmitter 22 and more particularly stabilized laser 23 having wavelength control unit 41 and calculation device 73 will now be described in the exemplary application of telecommunication system 21. Optical transmitter 22 is used in the system 21 to produce a modulated optical beam at any one of the plurality of ITU grid point frequencies or channels. Transmitter 22 can tune to any plurality of frequencies, preferably at least eight frequencies and more preferably a plurality of frequencies ranging from eight to 1000 in number. The frequency range corresponding to eight frequencies having a fixed separation of 50 GHz is 0.4 THz. Exemplary placement of such grid points on the transmission spectrum of locking reference element 72 are shown in FIG. 4, where a grid point 202 is provided on each increasing portion 85 and decreasing portion 86 of each peak 84. The spacing between each grid point is thus half the free spectral range of locking reference element 72. Capture range 93 is approximately twice such frequency spacing and thus approximately equal to such free spectral range.

Figure 9:
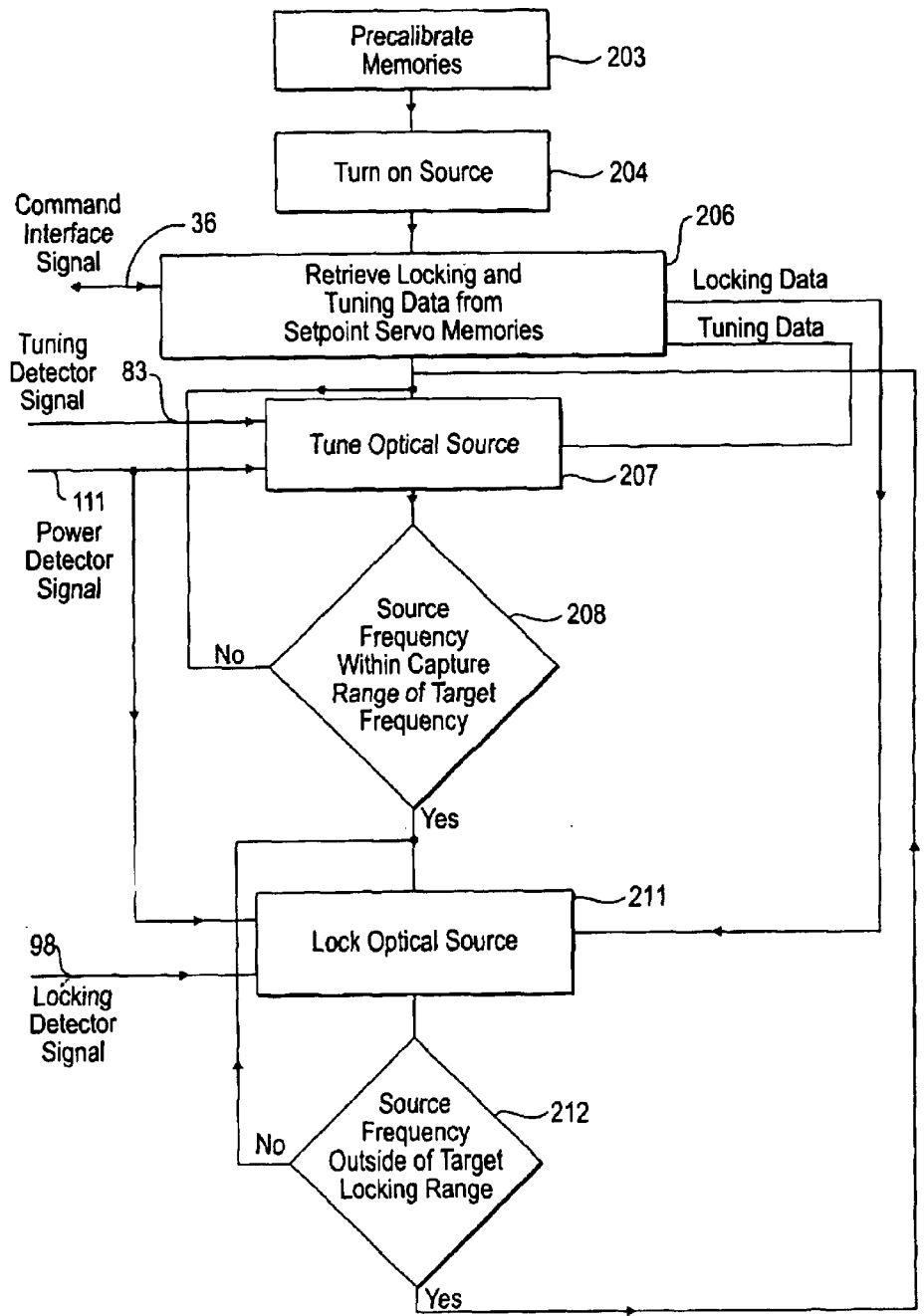
FIG. 9 is a flow chart of the operation of the apparatus for frequency tuning and locking of FIG. 2.

A flow chart of the operation of stabilized laser 23 is shown in FIG. 9. In step 203 therein, computer memory 123 of calculation device 73 and computer memory 173 of wavelength control unit 41 are precalibrated with constants for each frequency or channel of operation of the stabilized laser 23. Calibration of the laser 23 is commenced by connecting the digital signal processor 121 of the calculation device 73 and the digital signal processor 171 or wavelength control unit 41 to an external computer which communicates with processors 121 and 171 by means of the bus utilized for providing command interface signal 36 to the processors. The wavelength of input beam 26 is controlled by such external computer during calibration. An external frequency measuring device, such as an optical spectrum analyzer is connected to the external computer to provide a feedback signal to such computer.

Estimated values for the setpoint constant or constants of wavelength control locker 33, such as those that allow calculation of a gain signal 148 to locking frequency adjust amplifier 147, are supplied to processor 121 in step 203. Such a value of gain signal 148, for example, may be chosen to correspond to initial frequency setpoint approximations that lie on a horizontal line across the frequency spectrum of FIG. 4. Such frequency setpoint approximations may lie on both the increasing portion 85 and decreasing portion 86 of each transmission peak 84. The frequency of input beam 26 from optical source 24 is then tuned across the desired range of operating wavelengths and the zero points for locking error signal 153 for each frequency determined. Such zero points correspond to the initial setpoint approximations on the transmission curve of FIG. 4.

The setpoint constants for calculation device 73 corresponding to each lock point 202 relating to a desired channel frequency of operation are determined next. With the foregoing estimated values of gain signals 148 and 152 remaining unchanged, source 24 is tuned to a lock point 202 corresponding to a first desired frequency of operation. Gain signal 148 to locking frequency adjust amplifier 147 is then changed until the error analog signal 153 is zero at the desired channel frequency. The data needed by processor 121 to generate the value of gain signal 148 and the gain signal 152 at the desired channel frequency are stored in setpoint memory 123 of the calculation device 73 in any suitable manner such as a look up table. Data needed to calculate the tuning signal setpoint and the polarity of the locking error signal 43 are also stored in setpoint memory 123 at this time. The polarity of the locking error signal is chosen to facilitate stable frequency locking of the optical source 23. Servo data required for the optimized conversion of locking error signal 43 to wavelength control signal 46 by the digital signal processor 171 are determined and stored in the servo memory 173 by the external computer.

The setpoint and servo data of calculation device 73 and wavelength control unit 41 for each other desired grid point frequency of operation are similarly determined and stored in respective setpoint memory 123 and servo memory 173. The calibration sequence of step 203 for each such other frequency is commenced with the initial estimated values of gain signals 148 and 152 being determined by the processor 121 from data supplied by the external computer in the same manner as described above.

If operation of stabilized laser 23 is desired at any off-grid channel frequency, the laser is similarly calibrated at such channel or channels and the corresponding setpoint and servo data stored in the computer memory of the laser 23 for each such off-grid channel. As can be seen, the relative location of grid pints 202 of each peak, the number of grid points 202 on each peak and the frequency spacing between grid points 202 are arbitrary and can be chosen and changed as desired.

The data stored in the setpoint memory of calculation device 73 and the servo memory of wavelength control unit 41 provide optimized values for the computation of the tuning and locking error signals 42 and 43 and wavelength control signal 46. Each grid point and off-grid frequency of operation is calibrated separately to provide optimized tuning and locking performance of the stabilized laser 23 in the presence of vibration, temperature excursions and other perturbations.

After calibration step 203 has been completed and the external calibration computer disconnected from processors 121 and 171, laser 23 can be installed for operation in an optical transmitter 22 for use in a telecommunications system 21. Operation of the laser 23 is commenced by turning on optical source 24, as shown in step 204 in FIG. 9. In step 206, a command input signal 36 is supplied to laser 23 indicating the frequency or channel to which the laser is to be tuned. Upon receipt of such signal 36, processor 121 retrieves from setpoint memory 123 the data required for the generation of the tuning signal setpoint, gain signals 148 and 152 and the locking polarity signal corresponding to the command interface signal 36. Processor 171 retrieves from servo memory 173 the optimized servo constants for the conversion of locking error signal 43 to wavelength control signal 46. The servo constants for the conversion of tuning error signal 42 to wavelength control signal 46 are typically constant across the operating range of stabilized laser 23.

Upon generation of an input beam 26 by tunable optical source 24, a corresponding tuning beam 76 impinges upon tuning reference element 71 to cause a tuning detector signal 83 to be supplied to calculation device 73. A power detector signal 111 is simultaneously supplied to the calculation device 73. In step 207 shown in FIG. 9, resulting tuning and power detector signals 83 and 111 are inputted into digital signal processor 121. The ratio of the tuning detector signal 83 to the power detector signal 111, which is approximately independent of the output power at source 24, is compared to the tuning setpoint value by processor 121. Specifically, a signed difference between the tuning setpoint value and such ratio is calculated to arrive at tuning error signal 42.

Digital signal processor 121 constantly monitors the magnitude of tuning error signal 42. Once the absolute value of the magnitude of signal 42 is less than a capture range limit, then wavelength locker 33 switches to its locking sequence in accordance with step 208 in FIG. 9. The frequency extent of the capture range 93 is determined by the magnitude of the capture range limit.

A locking detector signal 98 is generated once source 24 is turned on in step 204. In step 211 of the flow chart in FIG. 9, the locking detector signal 98 and power detector signal 111 are compared to determined the locking error signal 158. Specifically, the power detector signal 111 is multiplied by the gain of the lock frequency adjust amplifier 147 and subtracted from locking detector signal 98. The electronic gain of amplifier 147 approximates the optical power transmission of locking element 72 at the selected frequency. Since both locking detector signal 98 and power detector signal 111 vary linearly with the power of input beam 26, the zero point of the difference signal between signals 98 and 111, that is the signal provided by summer 144 varies similarly with frequency.

The functional dependence of the optical power transmission of locking element 72 typically deviates from perfect periodicity in the sense that the spacing between transmission peaks, the shape of the transmission peaks and the maximum and minimum transmission values corresponding to a particular peak vary across the operating wavelength range of the wavelength locker 33. Periodicity deviations typically cause variations in the slope and magnitude of the error signal output of summer 144 and may introduce errors in the conversion of the analog error signal error signal 153 to a digital error signal 158 by analog to digital convertor 156. The gain magnitude adjust amplifier 151 corrects for these non-optimal variations in the slope and magnitude of the output signal from summer 144 at each setpoint. It thereby increases the accuracy of the digital locking error signal 153. Optimization also reduces the operating requirements of the analog to digital convertor 156 and thus reduces the cost of stabilized laser 23.

During the locking process, processor 121 compares the absolute value of the locking error signal 158 to a locking range limit value as represented by step 212. If the absolute value of the locking error signal 158 is less than locking range limit value, the frequency of source 24 is within the locking range of 94 and the locking sequence of step 211 continues. The frequency width of the locking range 94 is determined by the magnitude of the locking range limit. The locking direction of the locking reference element 72 is determined by the error signal polarity data for each individual channel. The error signal polarity is chosen to provide stable locking operation of the stabilized source 23. Error signal polarities have opposite signs for points on a decreasing portions 85 and increasing portions 86 of reference element 72.

The locking error signal 42 is provided to wavelength control unit 41. The control unit 41 retrieves data from servo memory 173 and calculates appropriate servo parameters for the conversion of locking error signal 43 to wavelength control signal 46. The wavelength control signal 46 is continuously adjusted to lock the output frequency of the optical source 24 to the desired channel frequency unless the absolute value of the locking error signal 43 exceeds the locking range limit. In this case the tuning sequence is re-initiated.

During operation of stabilized laser 23, various environmental or outside forces may alter the operating characteristics of the laser and/or otherwise necessitate correcting the frequency of output beam 32. For example, the laser 23 may experience operational temperatures above or below the temperature at which the laser was calibrated or be subjected to vibration or other mechanical forces. The locking process continuously stabilizes the laser output frequency in the presence of such perturbations. The locking range 94 is the frequency span over which the control system of the laser 23 can typically correct for environmentally induced frequency perturbations of the output of tunable optical source 24. Locking without the use of tuning reference element 71 is an important feature of the invention. Data stored in servo memory 173 of wavelength control unit 41 permits optimization of the locking process at each setpoint or channel.

When calculation device 73 and wavelength control unit 41 are combined into a wavelength controller like controller 186 shown in FIG. 8, the method of operation for stabilized laser 23 described above with respect to wavelength control unit 41 and calculation device 73 is performed by digital signal processor 187. Control program 188 in digital signal processor 187 includes the various electrical components and circuitry contained in processor 121 for deriving the tuning error signal 42 and the locking error signal 43. The functions of processor 171 are also incorporated into processor 187 of the controller 186. A stabilized laser containing controller 186 is calibrated in the same manner as discussed above for each desired operating frequency. For each channel, data required for the optimal conversion of detector signals 111, 83 and 98 to a wavelength control signal is retrieved by the digital signal processor 187 from the setpoint and servo memory 191.

Stabilized laser 23 with wavelength locker 33 is advantageous in many respects. Wavelength locker 33 separately optimizes both the tuning and locking signals, namely tuning error signal 42 and locking error signal 43, to rapidly change over the wavelength range of interest, instead of compromising the performance of one of such error signals. Such separate optimization thus enhances fast tuning and fast switching operations. Such fast operation provides robustness against environmental perturbations. Laser 23 incorporates the optical components for achieving wavelength tuning and locking in an integrated manner that requires fewer components than previously provided separate wavelength locking and tuning systems.

The highly linear function of tuning reference element 71 reduces the complexity of the associated tuning error generation circuitry, for example within processor 121 or processor 187, by minimizing the variation in gain necessary to generate an accurate tuning error signal 42 across the locking frequency range of the wavelength locker 33. Tuning reference element 71 preferably has a performance range equal to the entire wavelength range of interest.

The low finesse of locking element 72 provides a relatively large capture range 93 by minimizing frequencies in the free spectral range of the locking element where the change and slope of the output power is at or close to zero. Capture range 93 is also increased by the two-sided locking permitted with locking reference element 72, that is the ability to lock on either an increasing portion 85 or decreasing portion 86 of a peak 84 (see FIG. 4). The increased capture range 93 reduces the required resolution and accuracy of tuning reference element 71, and thus results in lower manufacturing and/or design tolerances of element 71, since it permits a relatively large locking range 94 and further contributes to faster tuning speed. The low finesse of locking element also simplifies the control electronics of laser 23 by requiring a relatively small gain differential across the locking frequency range.

Laser 23 is robust against environmental disturbances. In this regard, the recovery behavior of the laser due to mechanical shock is enhanced by the relatively large locking range 94 of fine reference element 72. The larger the locking range the greater the ability of the control system of laser 23 to correct for environmental perturbations. Additionally, such large locking range 94 permits fast locking without the need of tuning reference element 71 following any such disturbance.

The two-sided locking technique used in locking reference element 72 facilitates locking to regularly-spaced grid points in cases where the free spectral range of the element 72 varies with frequency and/or the transmission resonances are asymmetric. Such two-sided locking techniques also permit the selection of lock points with variable frequencies spacing and minimize the overall size of the optical components of wavelength locker 33 by approximately doubling the capture range 93 of locking reference element 72.

The utilization of the electrical components within wavelength locker 33, for example within wavelength controller unit 41 and calculation device 73, that have been optimized for each frequency in the frequency range of interest permit the use of lower tolerance and thus cheaper optical components in wavelength locker 33. For example, various servomechanism electrical components within the wavelength locker, such as locking frequency adjust amplifier 147 and error magnitude adjust amplifier 151, are optimized for each frequency of laser operation by constants stored in the memory of locker 33. Such optimization further allows cost savings in the construction and alignment of the optoelectronic components of locker 33.

The variably optimizable components of wavelength locker 33 also allow laser 23 to be calibrated and operate precisely at off-grid frequencies without additional hardware. Such components further permit the laser to change its characteristics to optimize the transient performance of such servomechanisms at each frequency and store the optimized performance values on a frequency by frequency basis.

Figure 10:
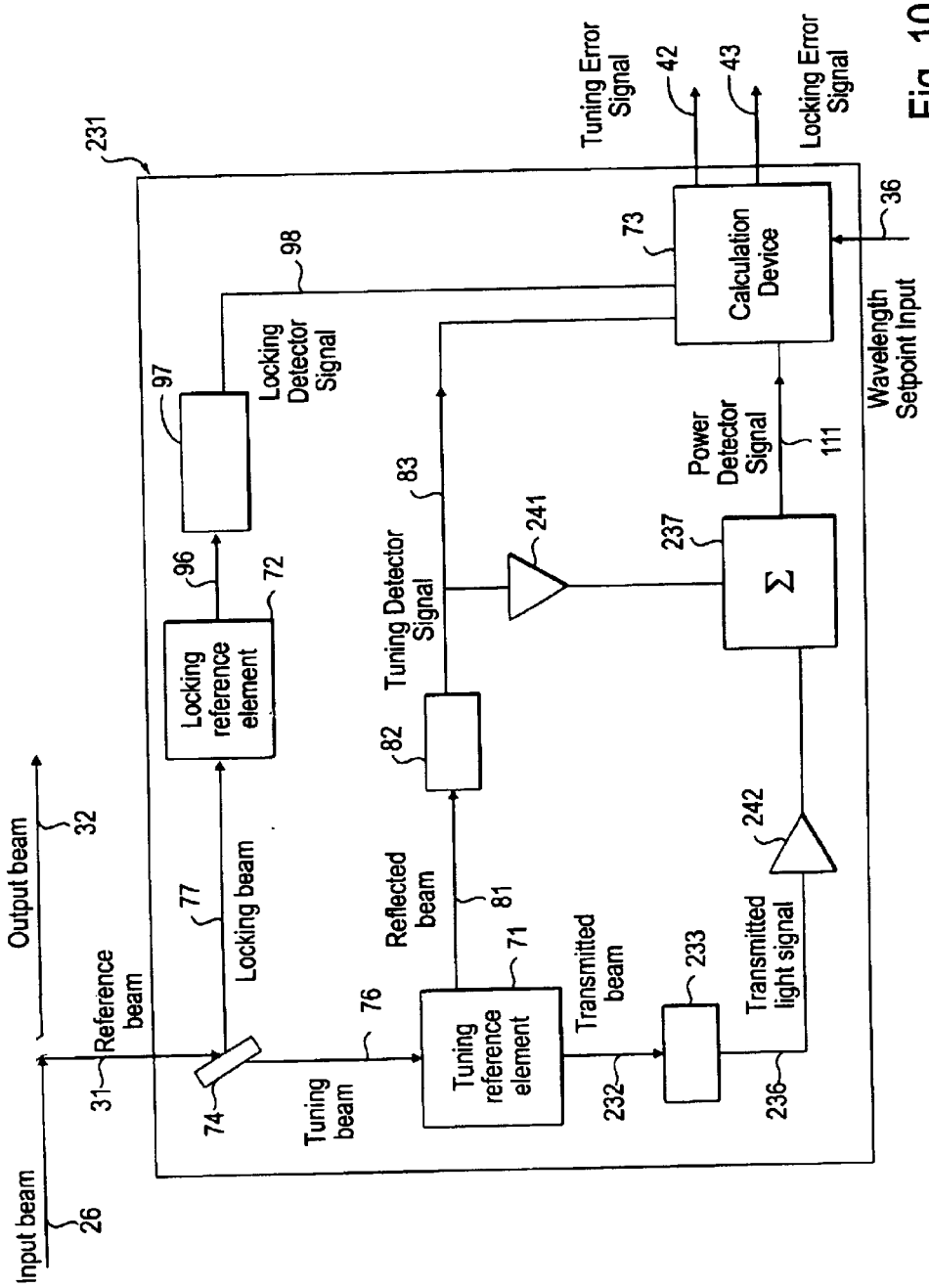
FIG. 10 is another embodiment of the apparatus for frequency tuning and locking of the present invention.

Other embodiments of wavelength locker 33 can be provided and be within the scope of the present invention. Wavelength locker 231 shown in FIG. 10 is similar to wavelength locker 33 and like reference numerals have been used to describe like components of wavelength lockers 33 and 231. The reflected beam from tuning reference element 71 serves as filtered tuning beam 81 and is incident on first optical detector 82 for providing a tuning detector signal 83 to calculation device 73. Tuning reference element 171 produces an additional beam of light in the form of transmitted beam 232 which, unlike wavelength locker 33, is utilized in wavelength locker 231. In this regard, transmitted beam 232 is incident on an additional optical detector 233 which measures the power of the transmitted beam and produces an additional optical signal in the form of transmitted light signal 236.

Summation circuitry in the form of summer 237 is coupled to the output of first optical detector 82 and additional optical detector 233. Tuning detector signal 83 and transmitted light signal 233 are converted from current modulated signals to voltage modulated signals by respective first and second amplifiers 241 and 242 before being received by summer 237. The summer is electrically coupled to calculation device 73 and produces an output power signal in the form of power detector signal 111 for processing by calculation device 73. Amplifiers 241 and 242 eliminate the current to voltage modulation function of amplifier 132 in the calculation device discussed above. Tuning error signal 42 and locking error signal 43 produced by calculation device 73 are received by wavelength control unit 41 of a stabilized laser incorporating wavelength locker 231.

In operation and use, wavelength locker 231 operates in substantially the same manner as wavelength locker 33 discussed above. Tuning detector signal 83, locking detector signal 98 and power detector signal 111 are operated on by calculation device 73 and wavelength control unit 41 in a manner described above for tuning optical source 24. Summer 237 produces a power detector signal 111 approximating the power of input beam 26 by measuring the power of the two output beams of tuning reference element 71. The power measurement signal 111 can be used in the manner discussed above with respect to wavelength locker 33 to calculate tuning and locking setpoint values for use by calculation device 73.

Wavelength control unit 231 has one less optical component, specifically one less optical power divider, than wavelength locker 33. Such reduction in optical components can serve to reduce the cost and greatly improve the manufacturability of locker 231.

Figure 11:
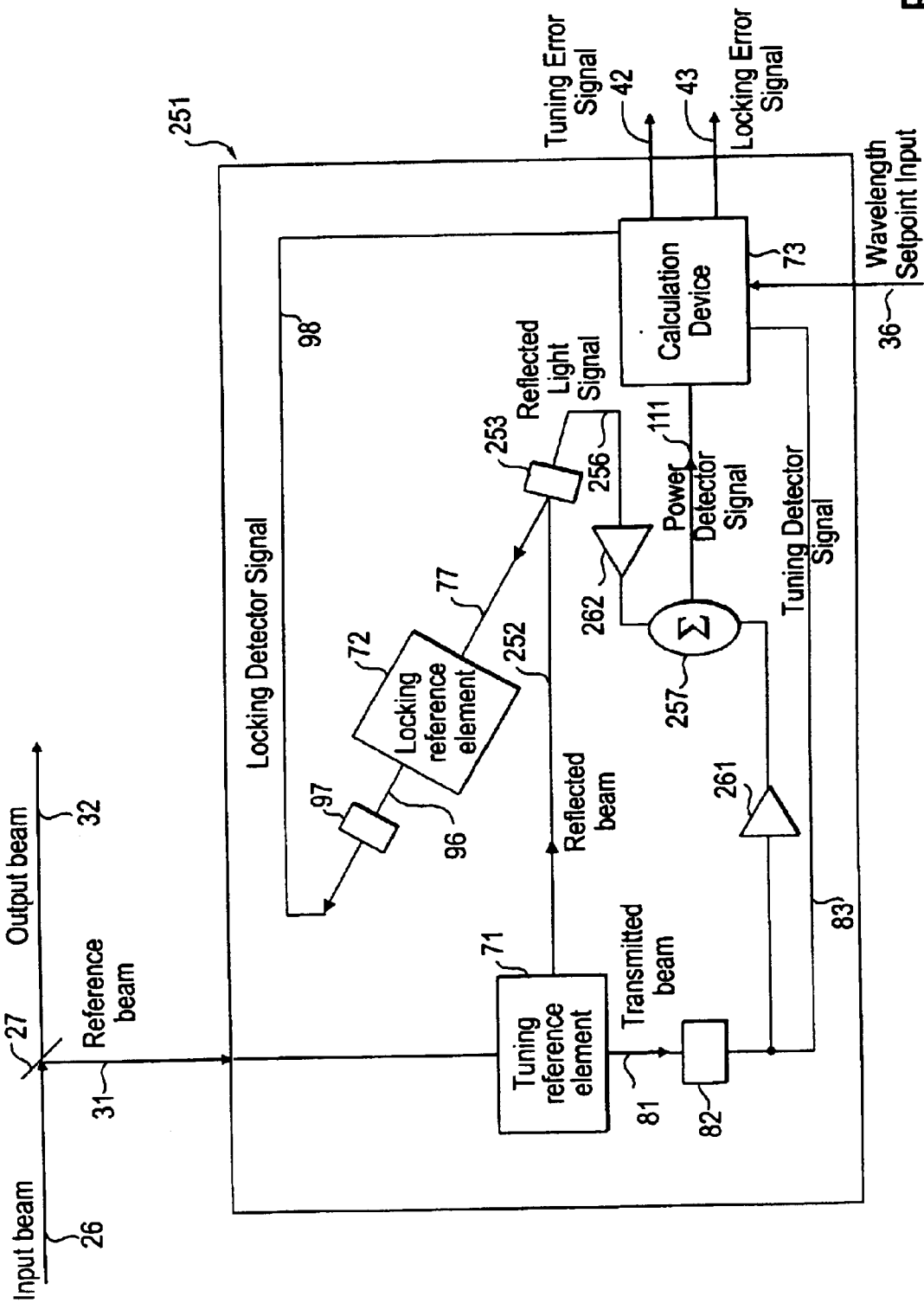
FIG. 11 is a further embodiment of the apparatus for frequency tuning and locking of the present invention.

A further embodiment of the wavelength locker of the present invention is disclosed in FIG. 11. Wavelength locker 251 therein is similar to wavelength locker 33 and like reference numerals have been used to describe like components of wavelength lockers 33 and 251. The transmitted beam from tuning reference element 71 of wavelength locker 251 serves as filtered tuning beam 81 for generating tuning detector signal 83. Reflected beam 252 from tuning reference element 71 is incident on an additional optical detector 253. An electronic signal in the form of a reflected light signal 256 is produced by optical detector 253. A portion of the reflected beam 252 incident on additional optical detector 253 is reflected by the detector 253 and serves as the locking beam 77 incident on locking reference element 72.

Summation circuitry in the form of summer 257 is electrically coupled to the output of first optical detector 82 and additional optical detector 253 for generating power detector signal 111. Tuning detector signal 111 is amplified by first amplifier 261 before being inputted into summer 257 and reflective light signal 256 is amplified by second amplifier 262 before being inputted to the summer 257. Like amplifiers 241 and 242 of wavelength locker 231, first and second amplifiers 261 and 262 serve as current to voltage converters and eliminate the current to voltage modulation function of amplifier 132 in calculation device 73. In addition, second amplifier 262 compensates for the portion of reflected beam 252 reflected by additional optical detector 253 as locking beam 77.

Second optical detector 97 measures the output power of filtered locking beam 96 from locking reference element 72 and produces locking detector signal 98. Each of the detector signals 83, 98, and 111 are inputted into calculation device 73 for processing therein in the manner discussed above to produce a tuning error signal 42 and a locking error signal 43.

Wavelength locker 251 advantageously further minimizes the number of optical components in stabilized laser 23 by eliminating the need for any optical power dividers within the locker 251. Only beam splitter 27 is provided in stabilized laser 23 for directing reference beam 31 into the wavelength locker 251. Such further reduction in optical components relative to previously described embodiments of the wavelength locker of the present invention can further reduce the cost of such wavelength locker through reduced parts count and ease of manufacture.

As discussed above, it should be appreciated that calculation device 73 of each of wavelength lockers 231 and 251 and the related wavelength control unit 41 can be combined into a signal controller such as wavelength controller 186. Calculation device 73 and wavelength control unit 41 or alternatively wavelength controller 186 can include a combination of analog and digital components or only digital components and can include one or more processors.

The fine reference elements of the present invention have been disclosed for use with two-sided locking techniques. It should be appreciated, however, that such fine reference elements and the apparatus and methods of the present invention can be used with single-sided locking techniques.

Although the frequency or wavelength lockers and stabilized lasers of the present invention have been described and shown for use in telecommunications applications, it should be appreciated that such lockers and lasers can be used in a variety of other applications. For example, such lockers and lasers can be used in free-space wavelength division multiplexed (WDM) communications systems for inter-satellite communications or short-range terrestial links. Another exemplary application of such lockers and lasers is chemical detection or remote sensing, where the output of a laser is directed along a sample-path to a detection system. The wavelength lockers and stabilized lasers disclosed herein can operate at wavelengths from the ultraviolet through the far infrared.

As can be seen from the foregoing, an apparatus for frequency tuning and locking for use with an optical tunable source has been provided. The apparatus separately optimizes the locking and tuning signals and has a relatively high immunity to external environmental forces such as mechanical shock and vibration. The apparatus is suitable for use in an optical telecommunications system and is of minimal size, has a minimal component count and can be manufactured at a reduced cost.

What is claimed is:

1. An apparatus for frequency tuning and locking for use with an optical source tunable over an optical frequency range and producing an output beam of light having a frequency comprising a first reference element having an output power that varies monotonically with input frequency over the operating frequency range and being adapted to receive at least a portion of the output beam of light, the first reference element producing a first reference beam of light, a second reference element having an output power that is frequency dependent and being adapted to receive at least a portion of the output beam of light, the second reference element producing a second reference beam of light, a first optical detector for measuring the power of the first reference beam of light and producing a first reference signal, a second optical detector for measuring the power of the second reference beam of light and producing a second reference signal and electronic circuitry coupled to the first and second optical detectors for receiving the first and second reference signals and producing a coarse error signal for permitting coarse adjustment of the frequency of the output beam of light and a fine error signal for permitting fine adjustment of the frequency of the output beam of light.

2. The apparatus of claim 1 wherein the first reference element has an output power that is substantially linear with frequency.

3. The apparatus of claim 2 wherein the linearity of the output power has a root mean square correlation to a straight line better than 0.998.

4. The apparatus of claim 1 wherein the first reference element is a tuning element.

5. The apparatus of claim 4 wherein tuning element is selected from the group consisting of a multi-layer dielectric thin film reflector, a dispersive phase retarder plus at least one polarizer, a slowly varying light absorbing material and a dispersive Faraday retarder plus at least one polarizer.

6. The apparatus of claim 5 wherein the tuning element is a dielectric reflector.

7. The apparatus of claim 1 wherein the first reference element has an output power that varies monotonically with input frequency over a frequency range of at least 0.4 THz.

8. The apparatus of claim 1 wherein the second reference element is a fine reference element having a multi-peaked transmission spectrum.

9. The apparatus of claim 8 wherein the second reference element has a periodic transmission spectrum.

10. The apparatus of claim 9 wherein the second reference element is selected from the group consisting of an interferometer and a metal film dielectric reflector.

11. The apparatus of claim 10 wherein the interferometer is an etalon.

12. The apparatus of claim 11 wherein the etalon has a finesse ranging from two to four.

13. The apparatus of claim 12 wherein the etalon has a finesse of approximately two.

14. The apparatus of claim 11 wherein the electronic circuitry provides a capture range approximating the free spectral range of the etalon.

15. The apparatus of claim 11 wherein the etalon has first and second spaced-apart reflectors and a medium of fused silica disposed between the first and second reflectors.

16. The apparatus of claim 11 wherein the etalon has a plurality of spaced-apart transmission peaks with increasing and decreasing portions, the electronic circuitry including a sign changing element for permitting locking on the increasing and decreasing portions of each transmission peak.

17. The apparatus of claim 8 wherein the second reference element has a nonperiodic transmission spectrum.

18. The apparatus of claim 8 wherein the second reference element is selected from the group consisting of a liquid absorption cell, a gas absorption cell, a resonant absorption cell and a solid reference material.

19. The apparatus of claim 1 further comprising an optical power divider for directing a first portion of the output beam of light to the first reference element and a second portion of the output beam of light to the second reference element.

20. The apparatus of claim 1 further comprising an additional optical detector for measuring the power of at least a portion of the output beam of light and producing a power reference signal, the electronic circuitry being electrically coupled to the additional optical detector and including circuitry for processing the second reference signal with the power reference signal to produce the fine error signal.

21. The apparatus of claim 1 wherein the first reference element produces an additional beam of light, an additional optical detector for measuring the power of the additional beam of light and producing an additional signal and summation circuitry coupled to the first optical detector and the additional optical detector for adding the first reference signal and the additional signal to produce a power reference signal, the electronic circuitry being electrically coupled to the summation circuitry and including circuitry for processing the first reference signal with the power reference signal to produce the coarse error signal and the fine error signal.

22. The apparatus of claim 21 wherein the additional optical detector produces a locking beam of light, the locking beam of light being the portion of the output beam of light received by the second reference element.

23. The apparatus of claim 1 further comprising an additional optical detector for measuring the power of at least a portion of the output beam of light and producing a power reference signal, the electronic circuitry being electrically coupled to the additional optical detector and including circuitry for processing the first reference signal with the power reference signal to produce the coarse error signal.

24. The apparatus of claim 23 wherein the second reference element is a fine reference element having a multi-peaked transmission spectrum.

25. The apparatus of claim 23 wherein the first reference element has an output power that is substantially linear with frequency.

26. A method for tuning and locking the output beam of an optical source tunable over an optical frequency range with a first reference element having an output power that varies monotonically with input frequency over the optical frequency range and with a second reference element having an output power that varies with frequency and is provided with a plurality of peaks over the optical frequency range comprising the steps of selecting a frequency of the output beam from the optical source, impinging a first portion of the output beam on the first reference element to produce a first reference beam which permits the optical source to tune to a frequency near the selected frequency and impinging a second portion on the output beam on the second reference element to produce a second reference beam which permits the optical source to lock on the selected frequency.

27. The method of claim 26 wherein the selecting step includes the steps of selecting a frequency located on an increasing portion of one of the plurality of peaks of the second reference element and selecting a frequency located on a decreasing portion of one of the plurality of peaks of the second reference element.

28. The method of claim 26 wherein the step of impinging a second portion of the output beam on the second reference element includes the step of measuring the power of the second reference beam to provide a reference signal, further comprising the steps of measuring the output power of a portion of the output beam to provide a power reference signal, adjusting the power reference signal as a function of the selected frequency to produce a set point value and subtracting the set point value from the reference signal to produce an error signal.

29. The method of claim 28 further comprising the step of changing the sign of the error signal.

30. The method of claim 26 wherein the step of impinging a second portion of the output beam on the second reference element includes the step of measuring the power of the second reference beam to provide a reference signal, further comprising the step of adjusting the reference signal by a predetermined constant stored in a computer memory and corresponding to the selected frequency.

31. The method of claim 26 wherein the first portion of the output beam includes the second portion of the output beam.

32. An apparatus for locking the frequency of an output beam of light from an optical source tunable to a plurality of frequencies over an optical frequency range comprising a coarse reference element having an output power that varies monotonically with input frequency over the optical frequency range and being adapted to receive at least a portion of the output beam of light, the coarse reference element producing a first reference beam of light, a fine reference element adapted to receive at least a portion of the output beam of light, the fine reference element producing a second reference beam of light, a first optical detector for measuring the power of the first reference beam of light and producing a first reference signal, a second optical detector for measuring the power of the second reference beam of light and producing a second reference signal, a computer memory having a plurality of predetermined constants corresponding respectively to the plurality of frequencies of the optical source and electronic circuitry for adjusting the second reference signal by the predetermined constant corresponding to the selected frequency to produce a fine reference signal.

33. The apparatus of claim 32 wherein the fine reference element is an etalon.

34. The apparatus of claim 32 wherein the fine reference element has a transmission spectrum that is periodic and includes a plurality of spaced-apart transmission peaks having respective increasing and decreasing portions, the electronic circuitry including an element to change the sign of the fine reference signal to reflect a selected frequency corresponding to the decreasing portion of one of the plurality of transmission peaks.

35. The apparatus of claim 32 wherein the electronic circuitry includes an adjustable gain amplifier.

36. The apparatus of claim 32 wherein the electronic circuitry includes a processor.

37. An apparatus for frequency tuning and locking for use with an optical source tunable over an optical frequency range and producing an output beam of light having a frequency comprising a first reference element having an output that varies with input frequency over the operating frequency range and being adapted to receive at least a portion of the output beam of light, the first reference element producing a first reference beam of light, a second reference element having an output power that is frequency dependent and being adapted to receive at least a portion of the output beam of light, the second reference element producing a second reference beam of light, a first optical detector for measuring the power of the first reference beam of light and producing a first reference signal, a second optical detector for measuring the power of the second reference beam and producing a second reference signal and electronic circuitry coupled to the first and second optical detectors for receiving the first and second reference signals and processing the first reference signal to produce a coarse error signal so as to permit coarse adjustment of the frequency of the output beam of light and processing the second reference signal to produce a fine error signal so as to permit fine adjustment of the frequency of the output beam of light.

38. The apparatus of claim 37 wherein the second reference element is a fine reference element having a multi-peaked transmission spectrum.

39. The apparatus of claim 37 wherein the first reference element has an output power that is substantially linear with frequency.

40. The apparatus of claim 37 wherein the optical frequency range comprises eight to 1000 tunable frequencies.

41. An apparatus for frequency tuning and locking for use with an optical source tunable over an optical frequency range in the 50 GHz ITU grid and producing an output beam of light having a frequency comprising a first reference element having an output that varies monotonically with input frequency over the operating frequency range and being adapted to receive at least a portion of the output beam of light, the first reference element producing a first reference beam of light, a second reference element having an output power that is frequency dependent and being adapted to receive at least a portion of the output beam of light, the second reference element producing a second reference beam of light, a first optical detector for measuring the power of the first reference beam of light and producing a first reference signal, a second optical detector for measuring the power of the second reference beam and producing a second reference signal and electronic circuitry coupled to the first and second optical detectors for receiving the first and second reference signals and processing the first reference signal to produce a coarse error signal so as to permit coarse adjustment of the frequency of the output beam of light and processing the second reference signal to produce a fine error signal so as to permit fine adjustment of the frequency of the output beam of light.

42. The apparatus of claim 41 wherein the second reference element is a fine reference element having a multi-peaked transmission spectrum.

43. The apparatus of claim 41 wherein the first reference element has an output power that is substantially linear with frequency.

44. The apparatus of claim 41 wherein the optical frequency range comprises eight to 1000 tunable frequencies.

* * * * *